(12) United States Patent
Awane et al.

(10) Patent No.: US 11,764,542 B2
(45) Date of Patent: Sep. 19, 2023

(54) SEMICONDUCTOR LASER DEVICE, AND METHOD AND PROGRAM FOR DRIVING THE SAME

(71) Applicant: HORIBA, Ltd., Kyoto (JP)

(72) Inventors: Yusuke Awane, Kyoto (JP); Katsumi Nishimura, Kyoto (JP); Kyoji Shibuya, Kyoto (JP)

(73) Assignee: HORIBA, LTD., Kyoto (JP)

( * ) Notice: Subject to any disclaimer, the term of this patent is extended or adjusted under 35 U.S.C. 154(b) by 246 days.

(21) Appl. No.: 16/756,551

(22) PCT Filed: Sep. 20, 2018

(86) PCT No.: PCT/JP2018/034924
§ 371 (c)(1),
(2) Date: Apr. 16, 2020

(87) PCT Pub. No.: WO2019/116660
PCT Pub. Date: Jun. 20, 2019

(65) Prior Publication Data
US 2020/0295535 A1    Sep. 17, 2020

(30) Foreign Application Priority Data
Dec. 15, 2017    (JP) .................................. 2017-240868

(51) Int. Cl.
*H01S 5/06* (2006.01)
*H01S 5/024* (2006.01)
(Continued)

(52) U.S. Cl.
CPC ........ *H01S 5/0612* (2013.01); *H01S 5/02415* (2013.01); *H01S 5/0687* (2013.01);
(Continued)

(58) Field of Classification Search
CPC ............. H01S 5/02415; H01S 5/06804; H01S 5/06837; H01S 5/0612; H01S 3/0405; H01S 5/3401–3402; H01L 23/38
See application file for complete search history.

(56) References Cited

U.S. PATENT DOCUMENTS 5,019,769 A * 5/1991 Levinson .............. H01S 5/0683
372/38.1
5,402,433 A * 3/1995 Stiscia ................ H01S 5/06832
372/38.01
(Continued)

FOREIGN PATENT DOCUMENTS

BR    PI0608301 A2 * 12/2009
CN    1663086 A * 8/2005    ........... H01S 5/0687
(Continued)

OTHER PUBLICATIONS

ISA Japan Patent Office, International Search Report Issued in International Application No. PCT/JP2018/034924, dated Dec. 18, 2018, WIPO, 4 pages.
(Continued)

*Primary Examiner* — Joshua King
(74) *Attorney, Agent, or Firm* — Alleman Hall Creasman & Tuttle LLP

(57) ABSTRACT

The present invention is intended to reduce variations in oscillation wavenumber of a semiconductor laser element due to the influence of circumferential temperatures. The invention includes a semiconductor laser semiconductor laser element, a temperature control part to control a temperature of the semiconductor laser element, a temperature sensor to detect a temperature of the temperature control part, and a temperature control device to control a supply signal to the temperature control part so that a detected temperature obtained from the temperature sensor reaches a predetermined target temperature. The temperature control
(Continued)

device changes a target temperature for the temperature control part depending on a supply signal to the temperature control part.

9 Claims, 6 Drawing Sheets

(51) Int. Cl.
    *H01S 5/0683* (2006.01)
    *H01S 5/0687* (2006.01)
    *H01S 5/12* (2021.01)
    *H01S 5/068* (2006.01)
    *H01S 5/34* (2006.01)

(52) U.S. Cl.
    CPC ...... *H01S 5/06804* (2013.01); *H01S 5/06837* (2013.01); *H01S 5/12* (2013.01); *H01S 5/3402* (2013.01)

(56) References Cited

U.S. PATENT DOCUMENTS

| | | | | |
|---|---|---|---|---|
| 5,604,758 | A * | 2/1997 | AuYeung | H01S 5/02415 372/38.1 |
| 5,754,574 | A * | 5/1998 | Lofthouse-Zeis | H01S 5/06808 372/34 |
| 6,807,206 | B2 * | 10/2004 | Tsukiji | H01S 5/06804 372/36 |
| 7,054,343 | B1 * | 5/2006 | Wu | H01S 5/4025 372/32 |
| 7,609,732 | B2 * | 10/2009 | Ishibashi | H01S 5/02415 62/3.2 |
| 9,184,557 | B2 * | 11/2015 | Mizuseki | H01S 5/06804 |
| 9,438,005 | B1 * | 9/2016 | Zhao | H01S 5/06255 |
| 2002/0114363 | A1 * | 8/2002 | Everett | H01S 5/06832 372/33 |
| 2002/0196595 | A1 * | 12/2002 | Ciancio | H01S 5/06804 361/93.1 |
| 2004/0004980 | A1 * | 1/2004 | Mazed | H01S 5/0687 372/32 |
| 2004/0114646 | A1 | 6/2004 | Stewart et al. | |
| 2005/0199779 | A1 * | 9/2005 | Noguchi | H01S 5/06825 250/205 |
| 2006/0182157 | A1 * | 8/2006 | Bollenz | H01S 5/06804 372/32 |
| 2007/0286610 | A1 * | 12/2007 | Ishibashi | H04B 10/564 398/197 |
| 2008/0047278 | A1 * | 2/2008 | Saad | F25B 21/02 62/3.7 |
| 2008/0144677 | A1 * | 6/2008 | Belkin | G01N 21/1702 372/20 |
| 2008/0279237 | A1 * | 11/2008 | Gurusami | H01S 5/024 372/34 |
| 2009/0147810 | A1 * | 6/2009 | Ishibashi | H01S 5/02415 372/34 |
| 2009/0161708 | A1 * | 6/2009 | Kawai | H01S 5/0687 372/34 |
| 2010/0246621 | A1 * | 9/2010 | Kuzukami | H01S 5/0687 372/38.02 |
| 2011/0243167 | A1 * | 10/2011 | Castillo | H01S 5/06804 315/309 |
| 2012/0033697 | A1 | 2/2012 | Goyal et al. | |
| 2013/0044777 | A1 * | 2/2013 | Amari | H01S 5/06804 372/34 |
| 2014/0341240 | A1 * | 11/2014 | Kannari | H01S 5/0612 372/34 |
| 2015/0146757 | A1 * | 5/2015 | Ohki | H01S 5/1064 372/50.23 |
| 2016/0245557 | A1 * | 8/2016 | Schaefer | F25B 21/02 |
| 2016/0254866 | A1 * | 9/2016 | Blumenthal | H01S 5/0687 398/197 |
| 2016/0329681 | A1 | 11/2016 | Tulip | |
| 2018/0166852 | A1 * | 6/2018 | Nukui | H01S 5/0612 |

FOREIGN PATENT DOCUMENTS

| | | | | |
|---|---|---|---|---|
| CN | 101350498 | A | | 1/2009 |
| CN | 1902753 | B * | 4/2011 | ............ H01L 23/34 |
| CN | 102313610 | A * | 1/2012 | ......... H01S 5/06804 |
| CN | 103728270 | A | | 4/2014 |
| CN | 105307555 | A * | 2/2016 | ........... A61B 1/0661 |
| CN | 108539574 | A | | 9/2018 |
| CN | 110707513 | A * | 1/2020 | ......... H01S 5/02415 |
| CN | 113328326 | A * | 8/2021 | |
| DE | 4429582 | A1 * | 2/1996 | ............ G01N 21/39 |
| DE | 3706635 | A1 * | 9/1998 | |
| DE | 102006028343 | A1 * | 1/2007 | .......... H01S 3/1312 |
| EP | 3399607 | A1 * | 11/2018 | |
| JP | 60229541 | A * | 11/1985 | ............ H04B 10/50 |
| JP | 03079094 | A | | 4/1991 |
| JP | H05259988 | A * | 10/1993 | |
| JP | H0728077 | B2 * | 3/1995 | |
| JP | H07249817 | A * | 9/1995 | |
| JP | 07273393 | A | | 10/1995 |
| JP | 2532450 | B2 * | 9/1996 | |
| JP | 2669309 | B2 * | 10/1997 | |
| JP | 2725012 | B2 * | 3/1998 | |
| JP | 1233869 | A | | 8/1999 |
| JP | 2005085815 | A | | 3/2005 |
| JP | 2006202992 | A * | 8/2006 | ......... H01S 5/02415 |
| JP | 4043844 | B2 * | 2/2008 | ........... H04B 10/504 |
| JP | 2008312038 | A * | 12/2008 | ......... H01S 5/0612 |
| JP | 2009216385 | A | | 9/2009 |
| JP | 2010123619 | A | | 6/2010 |
| JP | 2011108930 | A * | 6/2011 | |
| JP | 2011108930 | A | | 6/2011 |
| JP | 2013042089 | A * | 2/2013 | ......... H01S 5/06804 |
| JP | 2013089754 | A * | 5/2013 | ............... H01S 3/10 |
| JP | 2013164315 | A | | 8/2013 |
| JP | 2014078690 | A | | 5/2014 |
| JP | 5608922 | B2 * | 10/2014 | ............. G06F 1/206 |
| JP | 2014225583 | A | | 12/2014 |
| JP | 2016100380 | A * | 5/2016 | ........... G02F 1/0123 |
| JP | 2017101950 | A | | 6/2017 |
| KR | 100272403 | B1 * | 12/2000 | |
| KR | 20160146855 | A * | 12/2016 | |
| WO | WO-9219014 | A1 * | 10/1992 | ............... G01K 7/01 |
| WO | WO-2004042799 | A2 * | 5/2004 | ........... H01S 5/0612 |
| WO | 2013186834 | A1 | | 12/2013 |
| WO | WO-2013186834 | A1 * | 12/2013 | ......... H01S 5/06804 |
| WO | WO-2018150584 | A1 * | 8/2018 | |
| WO | WO-2018179306 | A1 * | 10/2018 | ......... H01S 5/02415 |

OTHER PUBLICATIONS

European Patent Office, Extended European Search Report Issued in Application No. 18887596.7, dated Jul. 28, 2021, Germany, 7 pages.

China National Intellectual Property Administration, Office Action and Search Report Issued in Application No. 201880065242.5, dated Dec. 21, 2022, 15 pages.

* cited by examiner

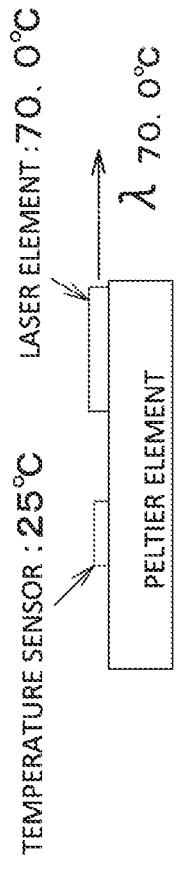
FIG. 7 (1) AMBIENT TEMPERATURE : 27°C
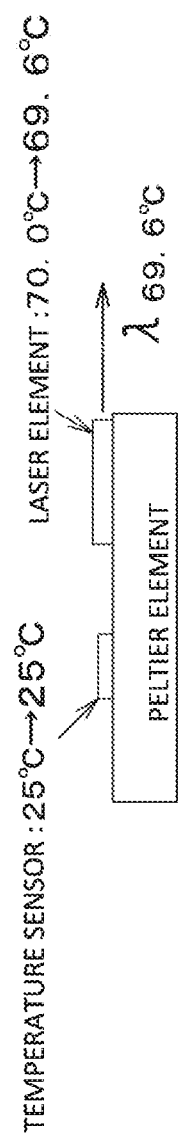
FIG. 7 (2) AMBIENT TEMPERATURE : 27°C→30°C
(BEFORE CHANGING TARGET TEMPERATURE)
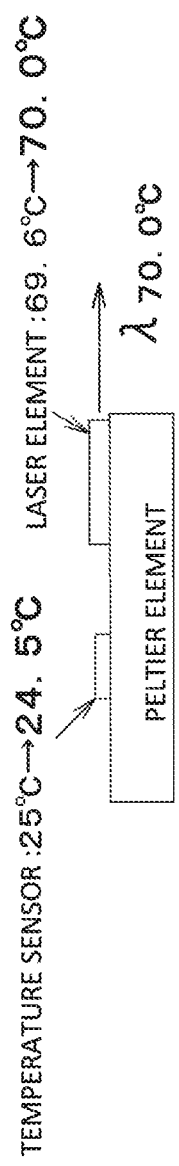
FIG. 7 (3) AMBIENT TEMPERATURE : 27°C→30°C
(AFTER CHANGING TARGET TEMPERATURE)

SEMICONDUCTOR LASER DEVICE, AND METHOD AND PROGRAM FOR DRIVING THE SAME

BACKGROUND OF THE INVENTION

Field of the Invention

The present invention relates to a semiconductor laser device, a method for driving a semiconductor laser device, and a program for driving a semiconductor laser device.

Background Art

Conventionally, there has been a gas analyzer that analyzes, for example, a measurement target component in exhaust gas by using a semiconductor laser device (for example, Patent Document 1). The gas analyzer includes the semiconductor laser device that emits a laser light having an oscillation wavenumber according to an absorption wavenumber of the measurement target component. The oscillation wavenumber is designed with an accuracy of an absorption wavenumber of $\pm 1$ cm$^{-1}$. Because the oscillation wavenumber is changed depending on an operating temperature of the semiconductor laser device, the semiconductor laser device is controlled so that variations in oscillation wavenumber of the laser light fall within $\pm 0.01$ cm$^{-1}$ by temperature control of the semiconductor laser device. In one which is designed to sweep the oscillation wavenumber of the laser light with respect to a predetermined central wavenumber, control is made so that variations in the central wavenumber falls within $\pm 0.01$ cm$^{-1}$.

A semiconductor laser element to emit laser light has conventionally been mounted on a cooling module including a Peltier element in order to perform the temperature control. A supply power to the Peltier element is controlled using a detected temperature obtained from a temperature sensor mounted on the cooling module. Thus, the operating temperature of the semiconductor laser element is adjusted to control so that the variations in the oscillation wavenumber of the laser light falls within $\pm 0.01$ cm$^{-1}$.

However, because the temperature of the semiconductor laser element is indirectly measured by the temperature sensor disposed separately from the semiconductor laser element, the temperature of the semiconductor laser element may not necessarily be identical with the detected temperature obtained from the temperature sensor even if the temperature control is performed using the detected temperature obtained from the temperature sensor. Specifically, even though the temperature sensor is subject to temperature control using the Peltier element, the temperature of the semiconductor laser element may be changed due to a circumferential temperature change. Consequently, variations larger than $\pm 0.01$ cm$^{-1}$ may occur in the oscillation wavenumber of the laser light.

PRIOR ART DOCUMENT

Patent Document

Patent Document 1: Japanese Unexamined Patent Publication No. 2009-216385

SUMMARY OF THE INVENTION

Problems to be Solved by the Invention

The present invention has been made to solve the above problem and has for its main object to ensure that the oscillation wavenumber of the semiconductor laser element is less likely to vary under the influence of the circumferential temperature.

Means for Solving the Problems

A semiconductor laser device in one of embodiments of the present invention includes a semiconductor laser element, a temperature control part to control a temperature of the semiconductor laser element, a temperature sensor to detect a temperature of the temperature control part, and a temperature control device to control a supply signal to the temperature control part so that a detected temperature obtained from the temperature sensor reaches a predetermined target temperature. The temperature control device changes a target temperature for the temperature control part depending on a supply signal to the temperature control part. A supply current, a supply voltage or a supply power is usable as a supply signal to the temperature control part.

If a circumferential temperature change occurs, a supply signal to the temperature control part is changed so that the detected temperature obtained from the temperature sensor reaches the target temperature. At this point, a temperature of the semiconductor laser element is different from the detected temperature obtained from the temperature sensor, and an oscillation wavenumber is therefore changed. With the present invention, the temperature control device changes the target temperature for the temperature control part depending on the supply signal to the temperature control part, and the temperature of the semiconductor laser element is therefore less likely to change due to a circumferential temperature change, and the oscillation wavenumber of the semiconductor laser element is therefore less likely to vary under the influence of the circumferential temperature.

In a specific embodiment of the temperature control device, the temperature control device preferably includes a relationship data storage part, a supply signal acquisition part and a supply control part. The relationship data storage part stores therein relationship data indicating a relationship between a supply signal to the temperature control part and a target temperature for the temperature control part. The supply signal acquisition part acquires a supply signal to the temperature control part. The supply control part acquires a target temperature for the temperature control part from the relationship data depending on the supply signal thus acquired, and controls the supply signal to the temperature control part so as to achieve the target temperature thus acquired. With this configuration, the oscillation wavenumber of the semiconductor laser element is less likely to vary under the influence of the circumferential temperature.

When controlling the temperature control part, it is conceivable that the supply signal varies slightly even in a stable state of the temperature control part. In this case, the target temperature may be changed in spite of that no circumferential temperature change occurs. Hence, the supply control part preferably acquires a target temperature for the temperature control part from the relationship data depending on an average value of the supply signal thus obtained, per predetermined period. The supply control part preferably does not change a target temperature for the temperature control part if a variation width of the average value of the supply signal thus obtained is less than a predetermined value.

If a setting value of an oscillation wavenumber of the semiconductor laser element is changed and used, the relationship data storage part stores therein relationship data indicating a relationship between a supply signal to the temperature control part and a target temperature for the temperature control part per oscillation wavenumber of the semiconductor laser.

In one of embodiments of the present invention, a method for driving a semiconductor laser device is intended to be applied to a semiconductor laser device. The semiconductor laser device includes a semiconductor laser element, a temperature control part to control a temperature of the semiconductor laser element, and a temperature sensor to detect a temperature of the temperature control part. The method includes controlling a supply signal to the temperature control part so that a detected temperature obtained from the temperature sensor reaches a predetermined target temperature. The method includes changing a target temperature for the temperature control part depending on a supply signal to the temperature control part.

In one of embodiments of the present invention, a driving program is used for a semiconductor laser device. The semiconductor laser device includes a semiconductor laser element, a temperature control part to control a temperature of the semiconductor laser element, a temperature sensor to detect a temperature of the temperature control part, and a control device to control a supply signal to the temperature control part so that a detected temperature obtained from the temperature sensor reaches a predetermined target temperature. The driving program causes the control device to perform a function of changing a target temperature for the control temperature part depending on a supply signal to the temperature control part.

Effect of the Invention

With the present invention as described above, the oscillation wavenumber of the semiconductor laser element is less likely to vary under the influence of the circumferential temperature because the target temperature of the temperature control part is changed depending on the supply signal to the temperature control part.

BRIEF DESCRIPTION OF THE DRAWINGS

FIGS. 7(1)-7(3) are schematic diagrams illustrating operation contents during a circumferential temperature change in the embodiment.

Figure 1:
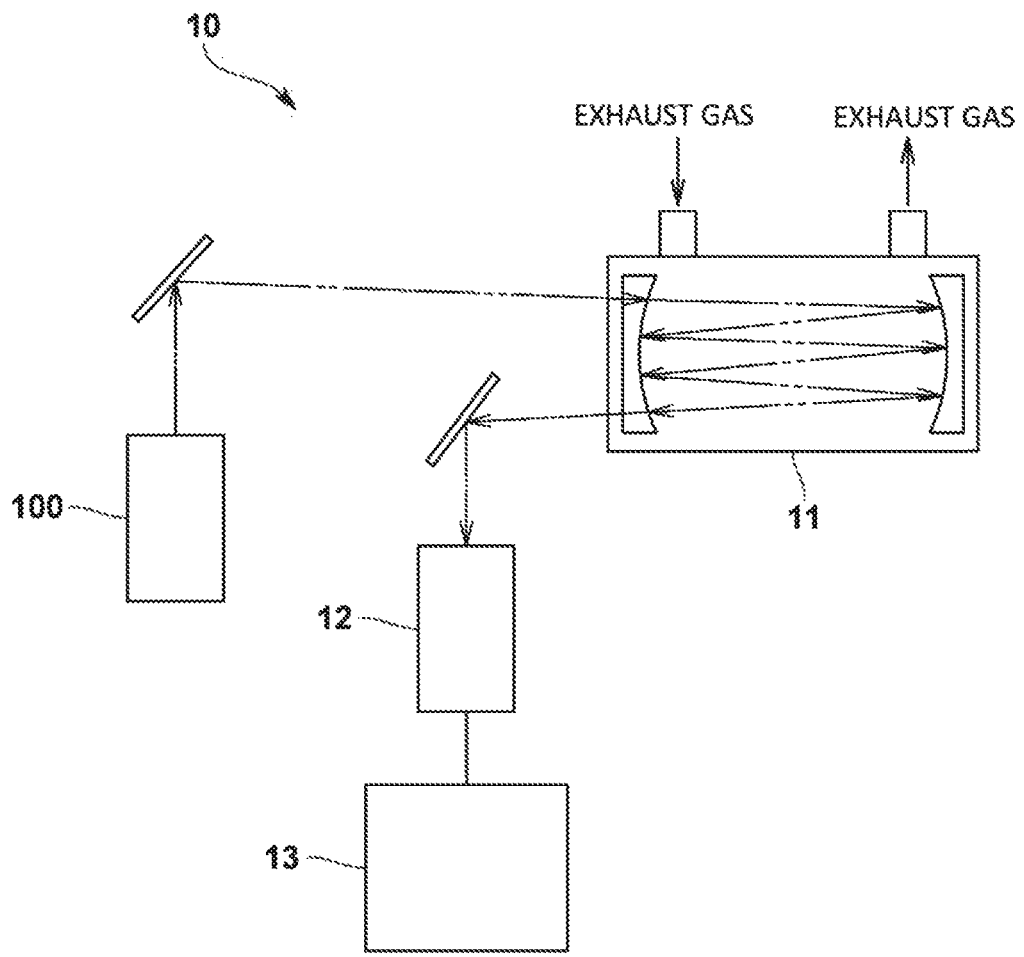
FIG. 1 is a general schematic diagram of an exhaust gas analyzer for which a semiconductor laser device in one of embodiments is used.

DESCRIPTION OF THE REFERENCE CHARACTERS 10 gas analyzer
11 measurement cell
12 photodetector
13 analysis part
100 semiconductor laser device
2 semiconductor laser element
32 Peltier element (temperature control part)
4 temperature sensor
temperature control device
51 relationship data storage part
52 supply signal acquisition part
53 supply control part

MODE FOR CARRYING OUT THE INVENTION

A semiconductor laser device in one of embodiments of the present invention is described below with reference to the drawings.

The semiconductor laser device 100 in the embodiment is intended to be used for a gas analyzer 10 that analyzes a measurement target component in exhaust gas discharged from, for example, an internal combustion engine or an external combustion engine, and in atmosphere as illustrated in FIG. 1. The gas analyzer 10 includes a multiple reflection type measurement cell 11 to permit introduction of the exhaust gas, the semiconductor laser device 100 to emit a laser light to the measurement cell 11, a photodetector 12 to detect the laser light after passing through the measurement cell 11, and an analysis part 13 to analyze the measurement target component by using a detection signal obtained from the photodetector 12.

Figure 2:
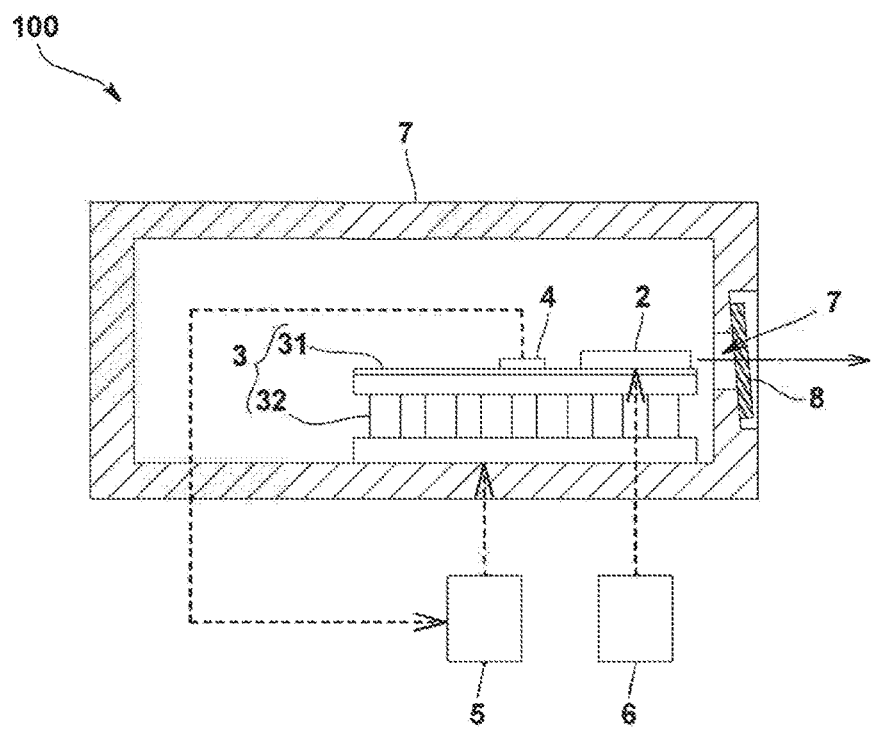
FIG. 2 is a general schematic diagram of the semiconductor laser device in the embodiment.

Specifically, the semiconductor laser device 100 is designed to emit a laser light having an oscillation wavenumber of approximately $\pm 1$ cm$^{-1}$ with respect to an absorption wavenumber of the measurement target component. As illustrated in FIG. 2, the semiconductor laser device 100 includes a semiconductor laser element 2, a temperature control module 3 to control a temperature of the semiconductor laser element 2, a temperature sensor 4 disposed in the temperature control module 3, and a temperature control device 5 to control the temperature control module 3 on the basis of a detected temperature obtained from the temperature sensor 4.

The semiconductor laser element 2 is, for example, a quantum cascade laser (QCL) element, and oscillates laser lights of, for example, mid-infrared (4-10 μm). The semiconductor laser element 2 is capable of modulating (changing) an oscillation wavenumber (oscillation wavelength) depending on an applied current (or voltage). The semiconductor laser element 2 is subject to current (voltage) control by the laser control device 6.

Figure 3:
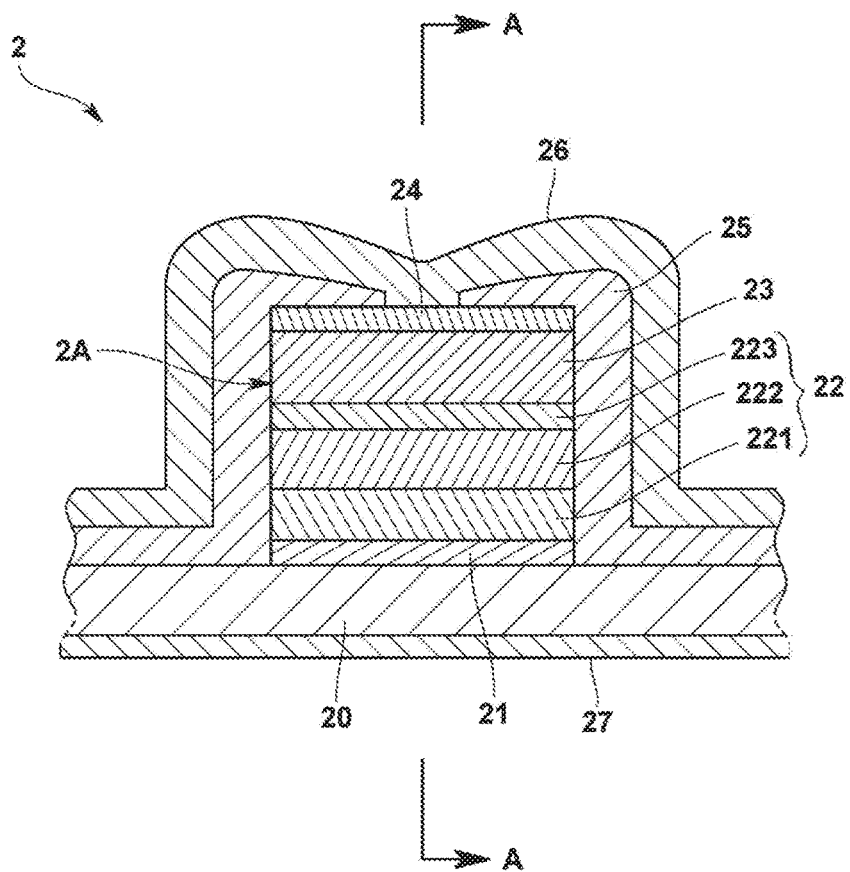
FIG. 3 is a sectional view orthogonal to an optical waveguide direction of a semiconductor laser element part in the embodiment.
Figure 4:
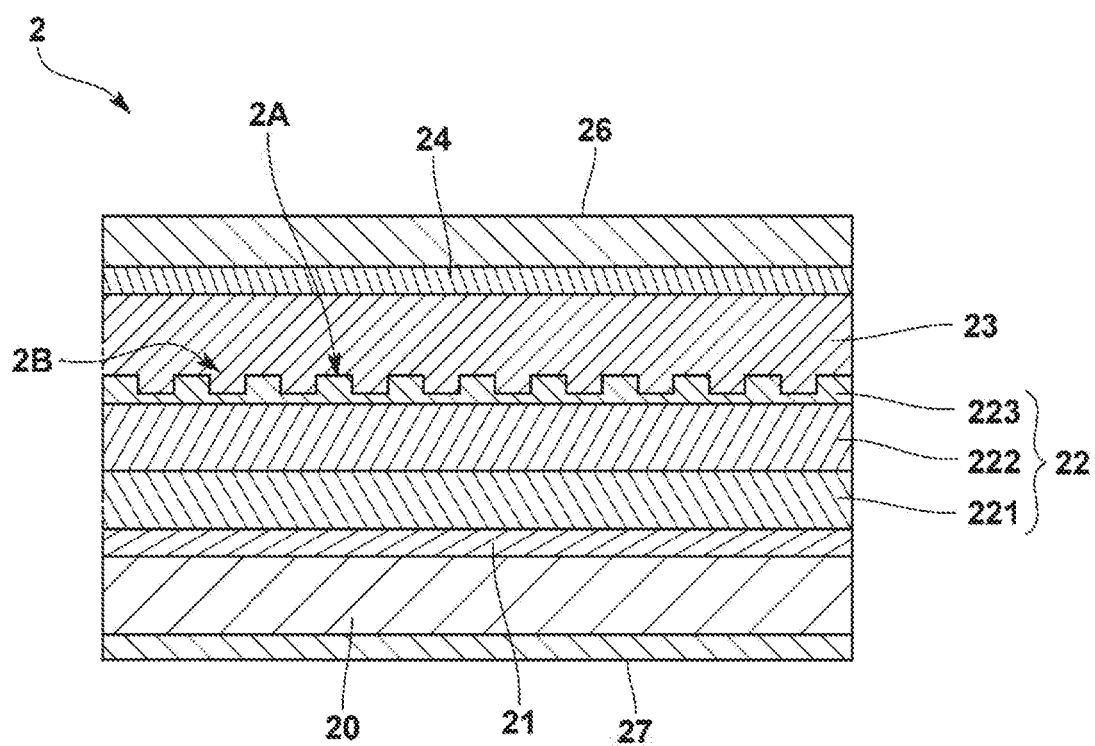
FIG. 4 is a sectional view taken along line A-A in the semiconductor laser element part in the embodiment.

The semiconductor laser element 2 is, for example, a distributed feedback laser (DFB laser), and includes an optical waveguide 2A composed of a clad layer and a core layer, each disposed on a semiconductor substrate 20 as illustrated in FIGS. 3 and 4. A light passes through the core layer due to a difference between a refractive index of the clad layer and a refractive index of the core layer in the optical waveguide 3A.

Specifically, the semiconductor laser element 2 is one in which a buffer layer 21, a core layer 22, an upper clad layer 23 and a cap layer 24 are formed in this order on an upper surface of the semiconductor substrate 20. These layers 21 to 24 are individually extended in an identical direction. The optical waveguide 2A extended in one direction can be formed by causing side surfaces of these layers in their width direction to be covered with a protection film 25. The protection film 25 is an inorganic film and may be composed of, for example, SiO$_2$ or a combination of SiO$_2$ and Si$_3$N$_4$.

The buffer layer 21 and the upper clad layer 23 are layers, each composed of InP. A lower clad layer composed of InP may be disposed between the buffer layer 21 and the core layer 22. Alternatively, the buffer layer 21 may serve as a clad layer.

The cap layer 24 is a layer composed of InGaAs, and a part of an upper surface of the layer (both sides in a width direction) is covered with the protection layer 25. Other parts of the upper surface of the cap layer 24 (a middle part in the width direction) are covered with an upper electrode 26.

The core layer 22 includes a lower guide layer 221 composed of InGaAs, an active layer 222 that emits light upon current injection, and an upper guide layer 223 composed of InGaAs.

The active layer 222 is composed of a multi quantum well structure including a plurality of well layers, in which a plurality of semiconductor layers serving as a light-emitting region and a plurality of semiconductor layers serving an injection region are alternately laminated one upon another. These well layers may be different in thickness. The semiconductor layer serving as the light-emitting region is formed by alternately laminating InGaAs and InAlAs. The semiconductor layer serving as the injection region is formed by alternately laminating InGaAs and InAlAs.

Figure 5:
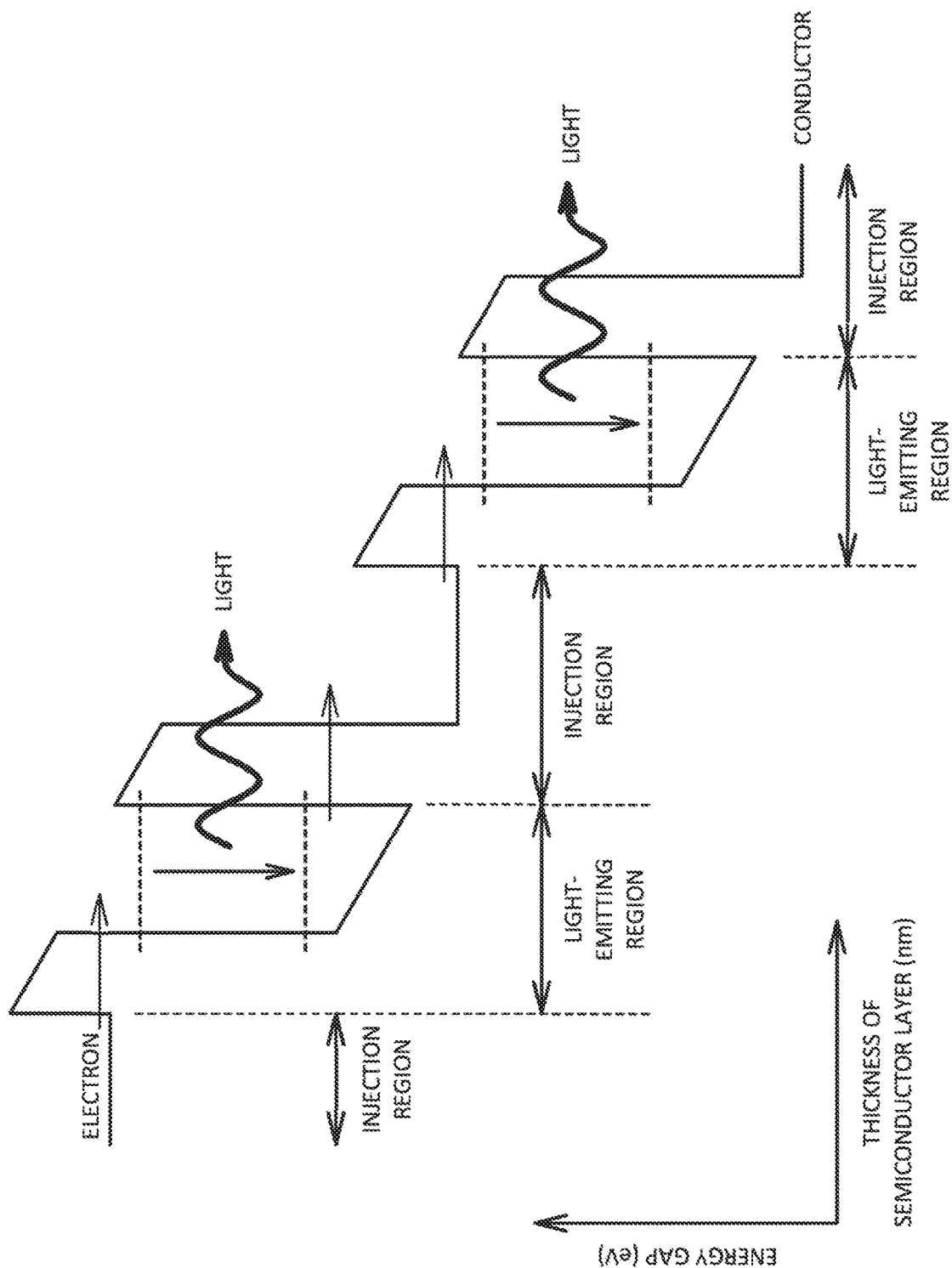
FIG. 5 is a diagram illustrating light emitting principle of quantum cascade laser.

A semiconductor layer element part thus configured is a quantum cascade laser, in which a plurality of cell layers are subjected to multistage connection as illustrated in FIG. 5, is designed to emit a light by optical transition between subbands formed in quantum cells. The semiconductor laser 2 may be a distributed bragg reflector laser (DBR laser).

A diffraction grating 2B is formed between the core layer 22 and the upper clad layer 23, namely, on the upper guide layer 223 in the semiconductor laser element 2 (refer to FIG. 4). The diffraction grating 2B is composed of concave parts and convex parts alternately formed on the upper guide layer 223, and the concave parts and the convex parts are extended in a width direction of the upper guide layer 223. Lights having a predetermined oscillation wavenumber are mutually intensified and selectively amplified by the diffraction grating 2B. The predetermined oscillation wavenumber is prescribed by a pitch of the diffraction grating 2B.

A lower electrode 37 is disposed on a lower surface of the semiconductor substrate 20. A laser light having a predetermined oscillation wavenumber prescribed by the diffraction grating 2B is emitted by applying a current (voltage) for laser oscillation to an upper upper electrode 26 and a lower electrode 27. A current source (or voltage source) is coupled to the upper electrode 26 and the lower electrode 27 that are intended for laser oscillation, and the laser control device 8 controls the current source (voltage source).

The laser control device 6 is designed to control the current source (or voltage source) of the semiconductor laser element 2 by outputting a current (voltage) control signal. Specifically, the laser control device 6 controls the current source (or voltage source) of the semiconductor laser element 2 by outputting a current (or voltage) control signal, thereby causing the semiconductor laser element 2 to be subjected to continuous wave operation (CW) or pulse-like oscillation (pulse driving). Ones which cause the pulse driving include pseudo continuous wave operation (pseudo CW).

The temperature control module 3 includes a substrate 31 having the semiconductor laser element 2 mounted on one surface thereof, namely, a front surface thereof, and a Peltier element 32 that is a temperature control part whose endothermic surface is contactedly disposed on the other surface, namely, rear surface of the substrate 31. The Peltier element 32 is a semiconductor element capable of controlling heat generation and heat absorption by using current. The Peltier element 32 has such a configuration that a plurality of alternately disposed N-type semiconductors and P-type semiconductors are connected in series by using a metal electrode, and they are held between a pair of ceramic substrates. Alternatively, the temperature control module 3 may not include the substrate 31, but may include a semiconductor laser element mounted on the ceramic substrate on a heat absorption side of the Peltier element 32. As a temperature control part, it is possible to employ, for example, one which uses a compressor, one which uses a heating wire, one which uses a fan, or one which employs a water-cooled system.

The temperature sensor 4 is disposed on a surface of the substrate 31 and intended to detect a temperature of the substrate 31 with the semiconductor laser element 2 mounted thereon. The temperature sensor 4 is, for example, a thermistor. Although the temperature sensor 4 is disposed away from the semiconductor laser element 2 in the embodiment, the temperature sensor 4 may be disposed in contact with the semiconductor laser element 2.

The semiconductor laser element 2 and the cooling module 3 are accommodated in a tight container 7 in the embodiment. A light outlet part 71, through which a laser light passes to the outside, is formed at a part of the tight container 7 which is opposed to a light emission part of the semiconductor laser element 2. An optical window member 8 is disposed on the light outlet part 71, and the optical window member 8 is inclined slightly (for example, 2 degrees) in order to prevent a laser light reflected from the optical window member 8 from returning to the semiconductor laser element 2. A light emitting module is constituted by the tight container 7 accommodating therein the semiconductor laser element 2 and the cooling module 3 or the like.

The temperature control device 5 is intended to perform feedback control of a supply current, a supply voltage or a supply power to the Peltier element 32 on the basis of a detected temperature obtained from the temperature sensor 4. Specifically, the temperature control device 5 controls the current source (voltage source) of the Peltier element 32 by outputting a current (or voltage) control signal.

The temperature control device 5 is a general-purpose or special-purpose computer including, as a structure thereof, CPU, memory, input/output interface and AD converter. The temperature control device 5 controls a supply power to the Peltier element 32 by causing the CPU and peripheral devices thereof to operate according to a driving program stored in the memory.

Figure 6:
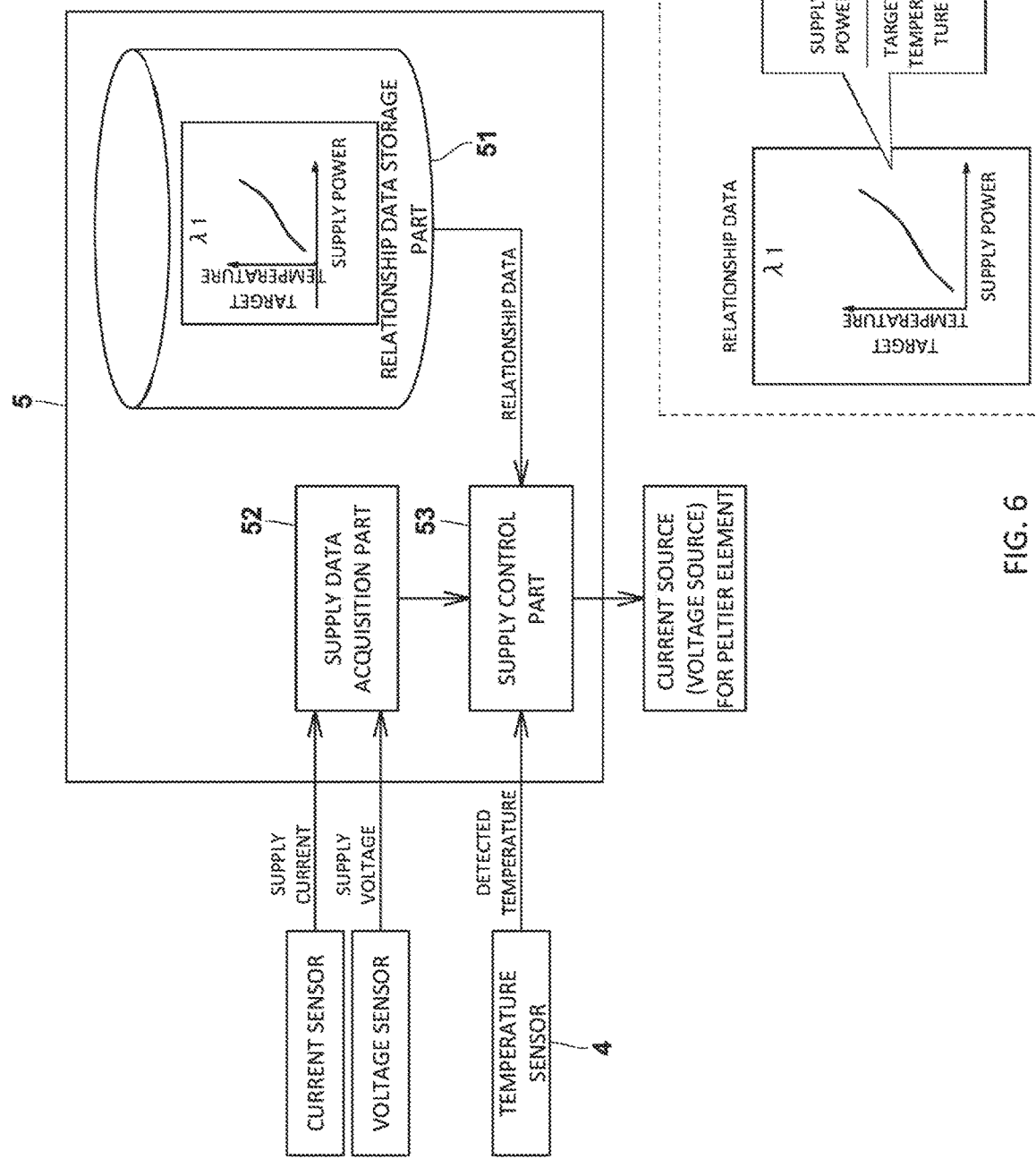
FIG. 6 is a functional block diagram of the semiconductor laser device in the embodiment.

Specifically, the temperature control device 5 includes a relationship data storage part 51, a supply data acquisition part 52 and a supply control part 53 as illustrated in FIG. 6. The relationship data storage part 51 stores therein relationship data indicating a relationship between a target temperature for the temperature sensor 4 and a supply power to the Peltier element 32 if an oscillation wavenumber of the semiconductor laser element 2 is made constant. The supply data acquisition part 52 acquires supply data indicating a supply power to the Peltier element 32. The supply control part 53 performs feedback control of the supply power to the Peltier element 32.

The relationship data storage part 51 stores therein relationship data indicating a relationship between a target temperature T for the temperature sensor 4 and a supply power P to the Peltier element 32 if the oscillation wavenumber (oscillation wavelength $\lambda_1$) of the semiconductor laser element 2 is made constant.

A method for generating the relationship data is, for example, as follows.

A light-emitting module of the semiconductor laser device 100 as a specimen is accommodated in a thermostatic container (not illustrated), and circumferential temperatures (ambient temperatures) are changed, for example, from 5° C. to 45° C. The Peltier element 32 is controlled so that the oscillation wavelength of the semiconductor laser element 2 becomes constant ($\lambda_1$) at the above circumferential temperatures.

A detected temperature obtained from the Peltier element 32 when the oscillation wavelength of the semiconductor laser element 2 became constant ($\lambda_1$) at the individual circumferential temperature and a supply power at that time are recorded. In terms of the supply power, a supply current and a supply voltage, each supplied to the Peltier element 32, are detected, and the supply power is calculated from the supply current and the supply voltage.

Thus, the relationship between the target temperature and the supply power when a circumferential temperature change occurs can be found in cases where the oscillation wavelength of the semiconductor laser element 2 is made constant ($\lambda_1$). The relationship data indicating this relationship is stored in the relationship data storage part 51. The relationship data may be data indicating a relationship between absolute values at individual target temperatures (T1, T2, T3, . . . ) and absolute values of individual supply powers (P1, P2, P3, . . . ) or, alternatively, data indicating a relationship between a variation relative to a target temperature (T1) serving as a criterion ($\Delta$T1(=T2−T1), $\Delta$T2(=T3−T1), . . . ) and a variation relative to a supply power (P1) serving as a criterion ($\Delta$P1(=P2−P1), $\Delta$P2(=P3−P1), . . . ).

In the case of generating relationship data relating not only a single oscillation wavelength ($\lambda_1$) but also a different oscillation wavelength ($\lambda_2$), the same operation as described above is carried out. The number of the relationship data is not limited to two, but it may be configured to have relationship data respectively relating to a plurality of oscillation wavelengths.

A circumferential temperature is detectable from a supply power by linking the circumferential temperature to the relationship data. That is, the Peltier element 32 is usable as a circumferential temperature sensor.

The supply data acquisition part 52 is designed to acquire a supply current and a supply voltage supplied to the Peltier element 32 and then calculate a supply power by using the supply current and the supply voltage in a state in which the Peltier element 32 is controlled so that a detected temperature obtained from the temperature sensor 4 reaches a constant target temperature.

The supply current supplied to the Peltier element 32 is detected by a current sensor, and the supply voltage is detected by a voltage sensor. If the Peltier element 32 is subjected to current control, a setting value for the current control is usable. If the Peltier element 32 is subjected to voltage control, a setting value of the voltage control is usable. The supply data acquisition part 52 outputs the calculated supply power data to the supply control part 53.

The supply control part 53 receives the relationship data from the relationship data storage part 51, and also receives the supply power data from the supply data acquisition part 52. Then, the supply control part 53 changes a target temperature for the temperature sensor 4 so that the oscillation wavenumber (oscillation wavelength), from the supply power data and the relationship data. The supply control part 53 then controls a supply power to the Peltier element 32 so that the detected temperature obtained from the temperature sensor 4 reaches a target temperature after being changed. The supply control part 53 is designed not to change the target temperature for the Peltier element 32 if a variation range of the acquired supply power is less than a predetermined value. The term "predetermined value" denotes a threshold value for distinguishing a variation width of the supply power generated in a state in which the Peltier element 32 is controlled so as to achieve the target temperature when no circumferential temperature occurs, and a variation width of a supply power which occurs when a circumferential temperature change occurs.

<Operations of Semiconductor Laser Device 100>

Operations performed to ensure that the oscillation wavenumber (oscillation wavelength) of the semiconductor laser device 100 becomes constant are described below with reference to FIGS. 7(1)-7(3). The following temperatures are for the purpose of description, which are different from actual values.

For example, suppose that the semiconductor laser element 2 is oscillated in a situation where a circumferential temperature (ambient temperature) is 27° C., and the Peltier element 32 is controlled so that a detected temperature obtained from the temperature sensor 4 reaches 25.0° C. It is also supposed that an actual temperature of the semiconductor laser element 2 is, for example, 70.0° C.

In this state, the laser control device 6 controls a current (or voltage) applied to the semiconductor laser element 2 so as to cause the semiconductor laser element 2 to emit a laser light having a predetermined wavenumber (predetermined wavelength) (refer to FIG. 7(1)).

If the circumferential temperature is changed from 27° C. to 30° C., the temperature control device 5 controls the Peltier element 32 so that a detected temperature obtained from the temperature sensor 4 reaches 25° C. At this point, a supply power to the Peltier element 32 is increased due to a circumferential temperature change, and the semiconductor laser element 2 is excessively cooled and changed to, for example, 69.6° C. The oscillation wavenumber (oscillation wavelength) varies accordingly (refer to FIG. 7(2)).

The supply data acquisition part 52 of the temperature control device 5 acquires supply power data for the Peltier element 32. The supply control part 53 of the temperature control device 5 changes a target temperature so that the oscillation wavenumber (oscillation wavelength) of the semiconductor laser element 2 becomes constant, from the supply power data and the relationship data. For example, the target temperature for the temperature sensor 4 is changed to 24.5° C. The supply control part 53 therefore controls a supply power to the Peltier element 32 so that the detected temperature obtained from the temperature sensor 4 reaches 24.5° C.

Effects of Embodiments

With the semiconductor laser device 100 of the above embodiment, the oscillation wavenumber of the semiconductor laser element 2 is less likely to vary under the influence of a circumferential temperature. This is because a target temperature is changed so that the oscillation wavenumber of the semiconductor laser element 2 becomes constant by using the relationship between a target temperature and a supply power to the Peltier element 32 if an oscillation wavenumber (oscillation wavelength) of the semiconductor laser element 2 is made constant.

For example, in cases where the semiconductor laser device 100 analyzes a measurement target component in exhaust gas, the circumferential temperature of the semiconductor laser element 10 may vary significantly due to a temperature influence of the exhaust gas as being a sample gas and an atmospheric temperature influence in addition to the influence of heat generated from the semiconductor laser element 2 itself. The semiconductor laser device 100, to which the present invention is already applied, is capable of highly precisely analyzing the exhaust gas because the oscillation wavenumber of the semiconductor laser element 2 is less likely to vary under the influence of the circumferential temperature. In cases where the semiconductor laser device 100 analyzes atmospheric pollutant or the like, there is some possibility of, for example, continuously analyzing the atmospheric pollutant in the open air in a range from several hours to several days, the semiconductor laser device 100 is susceptible to the atmospheric temperature influence. The semiconductor laser device 100, to which the present invention is already applied, is capable of highly precisely analyzing the atmospheric pollutant because the oscillation wavenumber of the semiconductor laser element 2 is less likely to vary under the influence of the circumferential temperature.

Other Modified Embodiments

The present invention is not limited to the foregoing embodiments.

For example, even though the power control part 53 of the temperature control device 5 is designed to change a target temperature by using the supply power data and the relationship data, the power control part 53 may be designed to adjust the supply power by using these data. For example, the power control part 53 adjusts a supply power by using a relationship of $\Delta WN_{corr} = a \times P_{pel} + b$, where $\Delta WN_{corr}$ is a correction amount of an oscillation wavenumber (a reciprocal of the oscillation wavenumber, $P_{pel}$ is a supply power to the Peltier element 32, and coefficients "a" and "b" are values included in the relationship data or values obtainable from the relationship data.

The supply signal acquisition part may be designed to acquire a supply signal indicating a supply current or a supply voltage to the temperature control part in the above embodiment. In this case, the relationship data storage part stores therein relationship data indicating a relationship between a target temperature and a supply current or supply voltage for the temperature control part when an oscillation wavenumber of the semiconductor laser element is made constant. The supply control part controls the supply current or supply voltage for the temperature control part so that a detected temperature obtained from the temperature sensor 4 reaches a target temperature after being changed by changing the target temperature for the temperature sensor 4 so that the oscillation wavenumber (oscillation wavelength) becomes constant, from the supply signal and the relationship data.

While the above embodiments have described the semiconductor laser devices including the quantum cascade laser element, the semiconductor laser device may include another semiconductor laser element 2.

The temperature control device 5 may be designed to determine deterioration and lifetime of the Peltier element by monitoring a change in resistance value of the Peltier element from a supply current and a supply voltage to the Peltier element.

Besides the above, various modifications and combinations of embodiments may be made as long as they do not depart from the spirit and scope of the present invention.

INDUSTRIAL APPLICABILITY

With the present invention, the oscillation wavenumber of the semiconductor laser element is less likely to vary under the influence of the circumferential temperature.

What is claimed is:

1. A semiconductor laser device, comprising:
   a semiconductor laser element:
   a temperature control part to perform a temperature control of the semiconductor laser element;
   a temperature sensor to detect a temperature of the temperature control part; and
   a temperature control device to control a supply signal to the temperature control part so that the detected temperature obtained from the temperature sensor reaches a predetermined target temperature, wherein
   the temperature control device changes the predetermined target temperature for the temperature control part depending on the supply signal to the temperature control part,
   the temperature control device comprises:
      a relationship data storage part configured to store therein relationship data indicating a relationship between the supply signal to the temperature control part and the predetermined target temperature for the temperature control part when an oscillation wavelength of the semiconductor laser element is constant,
      a supply signal acquisition part configured to acquire the supply signal to the temperature control part, and
      a supply control part configured to, when the acquired supply signal is changed, acquire the predetermined target temperature for the temperature control part from the relationship data depending on the acquired supply signal, and further configured to control the supply signal to the temperature control part so as to achieve the predetermined target temperature thus acquired,
   the supply control part is further configured to, when a change in the supply signal due to a change in ambient temperature is detected in a state in which the supply signal to the temperature control part is controlled so that the temperature detected by the temperature sensor becomes the predetermined target temperature, change the target temperature of the temperature control part from the supply signal and the relationship data according to a variation of the supply signal so that the oscillation wavelength of the semiconductor laser element is constant, and control the supply signal to the temperature control part so that the detected temperature detected by the temperature sensor becomes the changed target temperature.

2. The semiconductor laser device according to claim 1, wherein the supply control part acquires the predetermined target temperature for the temperature control part from the relationship data depending on an average value of the supply signal thus obtained, per predetermined period.

3. The semiconductor laser device according to claim 1, wherein the supply control part does not change the predetermined target temperature for the temperature control part if a variation of an average value of the supply signal thus obtained is less than a predetermined value.

4. The semiconductor laser device according to claim 1, wherein the relationship data indicates the relationship between the supply signal to the temperature control part and the predetermined target temperature for the temperature control part per oscillation wavelength of the semiconductor laser.

5. The semiconductor laser device according to claim 1, wherein the semiconductor laser element is composed of a multi quantum well structure including a plurality of well layers subjected to multistage connection, and the semiconductor laser element is designed to emit a light by optical transition between subbands formed in the plurality of well layers.

6. A gas analyzer to analyze a measurement target component included in gas, the gas analyzer comprising:
   a measurement cell to permit introduction of the gas,
   a semiconductor laser device according to claim 1 designed to emit a laser light to the measurement cell,
   an optical detector to detect a laser light after passing through the measurement cell, and
   an analysis part to analyze the measurement target component by using a detection signal obtained from the optical detector.

7. The semiconductor laser device according to claim 1, wherein the supply control part is configured to, only when the acquired supply signal is changed, acquire the predetermined target temperature for the temperature control part from the relationship data depending on the acquired supply signal, and further configured to control the supply signal to the temperature control part so as to achieve the predetermined target temperature thus acquired.

8. A method for driving a semiconductor laser device, the semiconductor laser device comprising a semiconductor laser element, a temperature control part to perform a temperature control of the semiconductor laser element, and a temperature sensor to detect a temperature of the temperature control part, the method comprising:
   storing a relationship data indicating a relationship between a supply signal to the temperature control part and a predetermined target temperature for the temperature control part when an oscillation wavelength of the semiconductor laser element is constant;
   acquiring the supply signal to the temperature control part;
   when the acquired supply signal is changed, acquiring the predetermined target temperature for the temperature control part from the relationship data depending on the acquired supply signal, and further configured to control the supply signal to the temperature control part so as to achieve the predetermined target temperature thus acquired;
   when a change in the supply signal due to a change in ambient temperature is detected in a state in which the supply signal to the temperature control part is controlled so that the temperature detected by the temperature sensor becomes the predetermined target temperature, changing the target temperature of the temperature control part from the supply signal and the relationship data according to a variation of the supply signal so that the oscillation wavelength of the semiconductor laser element is constant, and control the supply signal to the temperature control part so that the temperature detected by the temperature sensor becomes the changed target temperature,
   controlling the supply signal to the temperature control part so that the detected temperature obtained from the temperature sensor reaches the predetermined target temperature;
   changing the predetermined target temperature for the temperature control part depending on the supply signal to the temperature control part.

9. A non-transitory computer readable medium storing a driving program used for a semiconductor laser device comprising a semiconductor laser element, a temperature control part to perform a temperature control of the semiconductor laser element, a temperature sensor to detect a temperature of the temperature control part, a control device to control a supply signal to the temperature control part so that the detected temperature obtained from the temperature sensor reaches a predetermined target temperature, wherein
   the driving program is executable to cause the control device to store therein relationship data indicating a relationship between the supply signal to the temperature control part and the predetermined target temperature for the temperature control part when an oscillation wavelength of the semiconductor laser element is constant,
   the driving program is executable to cause the control device to acquire the supply signal to the temperature control part,
   the driving program is executable to cause the control device to, when the acquired supply signal is changed, acquire the predetermined target temperature for the temperature control part from the relationship data depending on the acquired supply signal, and further configured to control the supply signal to the temperature control part so as to achieve the predetermined target temperature thus acquired,
   the driving program is executable to cause the control device to, when a change in the supply signal due to a change in ambient temperature is detected in a state in which the supply signal to the temperature control part is controlled so that the temperature detected by the temperature sensor becomes the predetermined target temperature, change the target temperature of the temperature control part from the supply signal and the relationship data according to a variation of the supply signal so that the oscillation wavelength of the semiconductor laser element is constant, and control the supply signal to the temperature control part so that the temperature detected by the temperature sensor becomes the changed target temperature, and
   the driving program is executable to cause the control device to perform a function of changing the predetermined target temperature for the temperature control part depending on the supply signal to the temperature control part.

* * * * *